US010054654B2

(12) United States Patent
Grodzki et al.

(10) Patent No.: US 10,054,654 B2
(45) Date of Patent: Aug. 21, 2018

(54) DETERMINATION OF A CONTROL SEQUENCE FOR A MAGNETIC RESONANCE IMAGING SYSTEM

(71) Applicant: SIEMENS AKTIENGESELLSCHAFT, Munich (DE)

(72) Inventors: David Grodzki, Erlangen (DE); Bjoern Heismann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1449 days.

(21) Appl. No.: 13/860,609

(22) Filed: Apr. 11, 2013

(65) Prior Publication Data
US 2013/0271139 A1   Oct. 17, 2013

(30) Foreign Application Priority Data

Apr. 11, 2012 (DE) .................. 10 2012 205 864

(51) Int. Cl.
*G01R 33/483* (2006.01)
*G01R 33/54* (2006.01)
(Continued)

(52) U.S. Cl.
CPC ......... *G01R 33/543* (2013.01); *G01R 33/482* (2013.01); *G01R 33/4824* (2013.01); *G01R 33/3854* (2013.01)

(58) Field of Classification Search
USPC .................. 324/300–322; 600/407–435; 382/128–131
See application file for complete search history.

(56) References Cited

U.S. PATENT DOCUMENTS 6,452,391 B1   9/2002   Bernstein et al.
6,476,607 B1 * 11/2002   Dannels ............. G01R 33/4824
                                                          324/307
(Continued)

FOREIGN PATENT DOCUMENTS

GB         2 337 125      11/2002

OTHER PUBLICATIONS

Latta et. al.; Single Point imaging with suppressed sound pressure levels through radient-shape adjustment; Journal of Magentic Resonance 170; pp. 177-183; (2004).
(Continued)

*Primary Examiner* — Melissa Koval
*Assistant Examiner* — Tiffany Fetzner
(74) *Attorney, Agent, or Firm* — Schiff Hardin LLP

(57) ABSTRACT

In a method to determine a control sequence for a magnetic resonance imaging system in order to acquire echo signal-based raw magnetic resonance data in k-space along one or more trajectories on the basis of the control sequence, the control sequence is optimized so that, to control a gradient magnetic field for at least a predetermined portion of the control sequence, a change of an attribute of the gradient magnetic field is limited. The limitation takes place so that a momentary amplitude change rate of the gradient magnetic field falls below a predetermined amplitude change rate limit value, and/or so that a momentary direction change rate of the gradient magnetic field falls below a predetermined direction change rate limit value, and/or so that a momentary gradient change rate of the gradient magnetic field that is based on a combination of the momentary amplitude change rate and the momentary direction change rate falls below a predetermined gradient change rate limit value.

18 Claims, 6 Drawing Sheets

(51) Int. Cl.
*G01R 33/48* (2006.01)
*G01R 33/385* (2006.01)

(56) References Cited

U.S. PATENT DOCUMENTS

| | | | | |
|---|---|---|---|---|
| 6,937,015 B2* | 8/2005 | Heid | ............... | G01R 33/54 |
| | | | | 324/307 |
| 7,548,062 B1* | 6/2009 | Gurney | ............... | G01R 33/561 |
| | | | | 324/307 |
| 9,664,760 B2* | 5/2017 | James | ............... | G01R 33/4818 |
| 2003/0191386 A1* | 10/2003 | Heid | ............... | G01R 33/54 |
| | | | | 600/410 |
| 2012/0194185 A1 | 8/2012 | Ritter | | |
| 2013/0271139 A1* | 10/2013 | Grodzki | ............... | G01R 33/543 |
| | | | | 324/314 |
| 2017/0030986 A1* | 2/2017 | James | ............... | G01R 33/4818 |

OTHER PUBLICATIONS

Hennel; Fast Spin Echo and Fast Gradient Echo MRI With Low Acoustic Noise; Journal of Magnetic Resonance Imaging 13, pp. 960-966, (2001).

* cited by examiner

DETERMINATION OF A CONTROL SEQUENCE FOR A MAGNETIC RESONANCE IMAGING SYSTEM

BACKGROUND OF THE INVENTION

Field of the Invention

The invention concerns a method to determine a control sequence for a magnetic resonance imaging system, and a method to operate a magnetic resonance imaging system, a control sequence determination device to determine a control sequence for a magnetic resonance imaging system; and a magnetic resonance imaging system with such a control sequence determination device.

Description of the Prior Art

Magnetic resonance imaging procedures have found numerous usage, for example for medical applications as well as for non-destructive material and structural analysis of components and other examination subjects. In a magnetic resonance imaging system, for data acquisition a static basic magnetic field is typically overlaid with a targeted, spatially differing magnetic field (known as the gradient magnetic field). The basic magnetic field serves for the initial alignment and homogenization of magnetic dipoles (i.e. of rotational characteristics known as "spins") at examined nuclei. The spatial resolution of the acquired magnetic resonance signal used for imaging takes place at least in part by the gradient magnetic field.

Depending on the operating mode of the imaging system, different switching sequences and magnetic field strengths for the gradient magnetic field are established that can be generated and varied by the gradient coil system. These switching sequences are predetermined in a control sequence that likewise provides control of an RF transmission system of the imaging system in a temporally coordinated manner to emit radio-frequency pulses in order to deflect the magnetic dipoles in the examination region out of the basic alignment. The gradient coil system to generate the gradient magnetic field is typically a rapidly switched, electrically operated coil system with multiple gradient coils that generate magnetic fields (for example in spatial directions x, y and z orthogonal to one another) in an established manner with the use of currents that are in the range of a few 100 amps.

Due to interaction forces (Lorentz forces) of these currents with the basic magnetic field of the tomography system and the interaction of magnetic scatter fields of the gradient coil system (eddy current forces) with conductive regions of the tomography system, strong mechanical oscillations of the gradient coil system occur that—in addition to a high stress to the tomography system in mechanical terms—lead to severe generation of perceptible noise.

The control sequence can be optimized with regard to the noise generation of the tomography system. A number of different approaches that affect a large number of parameters of a control sequence are known for this purpose.

One possibility to optimize the control sequence is described for "Fast Spin-Echo (RARE)" or "Fast Gradient Echo (FLASH—fast low angle shot)" control sequences in an article by F. Hennel, "Fast Spin Echo and Fast Gradient Echo MRI With Low Acoustic Noise", Journal of Magnetic Resonance Imaging 13, 2001, P. 960 to P. 966. The underlying principles of the optimization are:

the gradient pulses of the control sequence have no plateau after the optimization, unless the selection of a different slice to be acquired takes place, and the time for a phase coding is expanded to a readout time period in which magnetic resonance signals have already been acquired.

Another possibility to improve the control sequence with regard to the noise generation is explained in the DE 198 14 950 A1, wherein the change of the strength of magnetic field gradients that are used for signal excitation and/or spatial coding follows a sigmoidal function whose second derivative has no maxima or minima. The use of multislice-selective pulses is necessary in order to be able to also apply this excitation sequence in "Echoplanar Imaging (EPI)" or "Echo shifting FLASH (ES-FLASH)" sequences.

In an article by P. Latta et al., "Single point imaging with suppressed sound pressure levels through gradient shape adjustment", Journal of Magnetic Resonance 170 (2004), P. 177 through P. 183, it is also explained that the noise emission of the gradient system can be minimized via suitable selection of the parameters "gradient amplitude A", "gradient plateau length P", "ramp rise time R" and "sequence repetition time TR".

An additional possibility to optimize a control sequence with regard to the noise exposure is disclosed in the U.S. Pat. No. 6,452,391 B1. The parameters "amplitude change rate", "amplitude" and "pulse duration" of the control sequence are modified for optimization.

In addition to the optimization with regard to the noise emission, in the modification of the control sequence it is also advantageous to achieve an optimally precise agreement with a desired target magnetization. A method to optimize multichannel pulse trains to produce agreement with a target magnetization is known from DE 10 2010 033 329 A1. Limits of hardware operating parameters of the RF transmission device that serves to generate the target magnetization are taken into account in the optimization.

As the large number of proposals indicates, there continues to be a need to minimize the noise emission of a tomography system.

SUMMARY OF THE INVENTION

An object of the present invention is to alleviate the problems associated with known methods that are described above.

According to the invention, a method is provided to determine a control sequence for a magnetic resonance imaging system in order to acquire echo signal-based raw magnetic resonance data in k-space along one or more trajectories on the basis of the control sequence.

The "echo signal-based raw magnetic resonance data" in the sense of the invention are raw magnetic resonance data that are acquired with the use of an echo sequence (for example EPI or TSE), in contrast to raw data that are based on the measurement of the free decay of the magnetization (FID; Free Induction Decay). According to the invention, these are control sequences with which magnetic resonance echo signals are produced by suitable switching of radio-frequency pulses and gradient pulses. The magnetic resonance echo signals are then acquired or detected (measured) to obtain echo signal-based raw magnetic resonance data.

Such echo signal-based methods or control sequences have particular advantages in contrast gain relative to FID control sequences. For example, T2 contrasts (contrast information that is obtained via the relaxation of the magnetic dipoles in a direction transversal to the basic magnetic field) are obtained only to a limited extent by FID-based magnetic resonance measurements, and T1 or PD contrast information (relaxation of the magnetic dipoles in the direction of the basic magnetic field or relaxation of protons and density information determined from these) of FID-based measurements differ significantly from acquired echo signal-based raw magnetic resonance data. Therefore, in many cases control sequences in clinically used applications are based on echo signal-based image acquisition methods.

However, the echo signal-based control sequences are frequently connected with intensive noise generation in magnetic resonance imaging system. This is due to the fact that the generation and acquisition of the echo signal in a plurality of time intervals take place at the RF excitation of the magnetization of the examination subject in methods for echo signal-based raw magnetic resonance data acquisition. Among other things, fast switching sequences of the gradient magnetic field that result from this contribute to the noise development with these control sequences frequently being particularly intensive.

The magnetic resonance imaging system control sequence according to the invention includes a number of radio-frequency pulses with gradient pulses arranged matching these (in terms of time), i.e. varying gradient magnetic fields that are required in order to graphically acquire a two-dimensional slice or a slice stack or, respectively, a 3D volume of an examination subject. This means that the invention also concerns trajectories that are not limited to the acquisition of a two-dimensional slice, but rather proceed in a three-dimensional volume in k-space.

The control sequence can include one or more trajectories that in turn have on or more partial trajectories. A trajectory through k-space describes the temporally contiguous curve of the scan of k-space in a preferred, contiguous path in k-space between a start point of the trajectory in k-pace and an end point of the trajectory in k-space that is scanned chronologically following said start point. At each point in time between start point and end point, a direction of the trajectory that is established by the direction at the point subsequently scanned in k-space at the immediately following point in time can be associated with the trajectory in terms of its curve.

As used herein, the term "partial trajectory" describes a temporally contiguously acquired segment of the trajectory, wherein the partial trajectories that belong to a trajectory do not temporally overlap.

According to the invention, the control sequence—i.e. in particular the trajectories in k-space—is/are optimized with regard to the avoidance of noise generation so that, to control a gradient magnetic field for at least one predetermined portion of the control sequence, the change of said gradient magnetic field is limited in the manner that a momentary amplitude change rate of the gradient magnetic field falls below a predetermined amplitude change rate limit value, and that a momentary direction change rate of the gradient magnetic field (i.e. of the trajectory in k-space) falls below a predetermined direction change rate limit value.

The term "momentary"—analogous to general usage—means that the amplitude change rate, the direction change rate or, respectively, a gradient change rate (subsequently described in more detail) is determined relative to a time interval that is limited to a minimum (essentially the "moment"). This means that the time interval ideally tends towards 0. In reality, however, this time interval is ultimately predetermined by switching times of the aforementioned gradient coil system. The term "momentary" thus describes a finite minimum time period that is defined by the sampling rate or, respectively, the chronological distance of the sampling points in k-space (preferably by the minimum possible switching times of the gradient coil system), and typically is on the order of approximately half a millisecond (thus the minimum time period in which a reproducible variation of the gradient coil current can take place.

In accordance with the invention, the control sequence can include one or more individual but temporally contiguous "limiting segments". These are the segments of the control sequence in which the limitations according to the invention are complied with and that overall form the predetermined portion of the control sequence in which the limitations apply. In the limiting segment or limiting segments, at least multiple RF pulses or multiple gradient pulses respectively follow one another chronologically. However, it is not precluded that the limiting segment includes the entire control sequence, meaning that the predetermined portion can refer to the entire control sequence. In the course of the control sequence according to the invention, in particular a direction change of the trajectory (i.e. a direction change of the gradient magnetic field) or a transition from a first trajectory to a second trajectory can take place in a limiting segment (thus a segment to be assigned to the predetermined portion of the control sequence). According to the invention, the momentary direction change rate and the momentary amplitude change rate are simultaneously limited by the predetermined limit values in the predetermined portion, preferably when a direction change of the gradient magnetic field is present or, respectively, a change between two trajectories (which, for example, are acquired in immediate chronological succession) takes place in the control sequence, while in other regions of the trajectory or, respectively, segments of the control sequence the simultaneous limitation of the momentary direction change rate and the momentary amplitude change rate by the predetermined limit values is optional.

A simultaneous limitation can take place alternatively or additionally by a combination of the limit conditions for the momentary amplitude change rate and the momentary direction change rate. This means that the limitation can take place such that a momentary gradient change rate of the gradient magnetic field that is based on a combination of the momentary amplitude change rate and the momentary direction change rate falls below a predetermined gradient change rate limit value. A mutual dependency of the simultaneous limit conditions is thereby established in the form of a gradient change rate. For example, this can mean that the direction change rate limit value is simultaneously scaled depending on the amplitude change rate limit value. A weighted merging of the momentary change rates for different spatial directions with the aid of the gradient change rate limit value can also be similarly described. This means that the scaling of the change rates can be selected or can take place differently for different spatial directions, for example in order to map a specific damping response or mode spectrum of mechanical oscillations of the gradient coil system in the gradient change rate limit value.

With the use of the invention, by optimal selection of the curve of the gradient magnetic field it is possible to limit eddy current forces and the change of Lorentz forces that act radially on the gradient coil in terms of their time curve, such that the control sequence controls the gradient coil system with time-limited force change, nearly without noise generation.

The physical causes of acoustic noise in magnetic resonance imaging are complex. The invention is based on the recognition that the sound generation depends on the time change of the deflection of the gradient coil, thus mathematically the time derivative of the deflection of the gradient coil.

This can be described by radial forces on the gradient coil system. Radial forces on the gradient coil system in the magnetic resonance imaging system can essentially be modeled by two contributions.

Both contributions are significantly determined by an axial magnetic field $B_z$. The axial magnetic field 13, is thereby formed by the superposition of the homogenous basic magnetic field $B_0$ (typically running in the z-direction) and the spatially dependent projection $G_z$ at the modeling point of the force (i.e. the scalar product at the spatial vector of the modeling point of the force), meaning that $$B_z = B_0 + G_z. \tag{1}$$

A gradient vector in two-dimensional representation for axial slices (i.e. slices situated orthogonal to the z-direction) can be described as follows with the aid of a polar angle $\gamma$ by an amplitude $G_0$ and a direction provided by the direction from the origin to a point $(\cos \gamma, \sin \gamma)$ of a normal circle:

$$G = G_0(\cos \gamma, \sin \gamma). \tag{2}$$

A first of the two contributions to the radial forces on the gradient coil system is formed by eddy current forces $F_{rw}$ (mentioned above). These can be described by the product of the axial magnetic field $B_z$ and its time change:

$$F_{rw} = B_z \frac{d}{dt} B_z. \tag{3}$$

The axial magnetic field $B_z$ is in fact essentially dominated by the time-invariant basic magnetic field $B_0$ and nearly represents a constant of the imaging system. However, the dynamic portions that are decisive for the eddy current forces (i.e. for the change of the deflection of the gradient coil system, and therefore the noise generation) essentially result from the time change of the basic magnetic field that can be described by the change of the gradient vector G. As is apparent from the above Equation (3), one possibility to minimize eddy current forces is the limitation of the time change of the axial magnetic field $B_z$. This means that, to minimize the exposure forces, the requirement is posed that d/dt $B_z$ should be as small as possible. The time change of the axial magnetic field $B_z$ can (under consideration of Equation (1)) be described in linear approximation as a sum of the time change of the amplitude $G_0$ of the gradient magnetic field and the time change of the direction of the gradient magnetic field (i.e. of the gradient vector G). Then:

$$\frac{d}{dt} B_z(r) = \frac{d}{dt}(B_0 + G_z) \sim \frac{d}{dt} G_0 + G_0 \frac{d}{dt} \gamma \tag{4}$$

The last term in Equation (4) results since the $B_0$ field is essentially time-invariant, as was already mentioned. Corresponding summands including the change of $B_0$ as a factor are therefore omitted in the calculation of the time derivative.

In this linear approximation, the eddy current force at the location r (i.e. at the modeling point of the force on the gradient coil system) can then be described (using Equations (1) and (4)) with the aid of coefficients AP and RP, which describe the proportionality of the force effect of the change of the axial magnetic field in a spatially dependent manner (i.e. dependent on the polar angle of the modeling point of the force on the gradient coil). Then:

$$F_{rw} \sim AP \cdot \frac{d}{dt} G_0 + RP \cdot G_0 \frac{d}{dt} \gamma. \tag{5}$$

The exposure force $F_{rw}$ is thus determined by the change of the amplitude $G_0$ of the gradient magnetic field and the change of the angle or, respectively, the direction of the gradient magnetic field. Given typical values for d/dt $G_0$ of approximately 100 mT/m/ms and for $G_o$ of 20 mT/m, the effect of the angle change of the gradient magnetic field (and therefore a corresponding curvature of a gradient trajectory in k-space) exceeds the effect of the change of the amplitude (i.e. the strength) of the gradient magnetic field.

Lorentz forces $F_{rl}$ supply a second contribution to the radial forces. The significant Lorentz forces $F_{rl}$ can be described by the product of the axial magnetic field $B_z$ with a current I through the gradient coil system (which is designated as gradient current I in the following). This means that:

$$F_{rl} = B_z \cdot I \tag{6}$$

The change of the deflection of the coil due to this force can thereby be primarily described by the change of the Lorentz forces $F_{rl}$. The change of the Lorentz forces $F_{rl}$ is the derivative of the function in Equation (6) that is formed in linear approximation by a sum of sum components which take into account the time change of the gradient coil current I and the time change of the axial magnetic field $B_z$. Thus:

$$\frac{d}{dt} F_{rl} = I \cdot \frac{d}{dt} B_z + B_z \cdot \frac{d}{dt} I. \tag{7}$$

The change of the force at location r can in turn be described by the time change of $B_z$. Moreover, the time change of the gradient current I must be taken into account; this in turn corresponds to the time change of the amplitude $G_0$ of the magnetic field. This means that the change of the Lorentz forces $F_{rl}$ can also be minimized with the aid of the limitation of the time change of the amplitude $G_0$ and the limitation of the time change of the direction of the gradient magnetic field, such that the change of the deflection of the gradient coil system is reduced.

The requirement that both the time change of the gradient current (i.e. the amplitude of the gradient magnetic field) and the time change of the angle of the gradient magnetic field $B_z$ should be as small as possible results from the limitation of the eddy current forces and the time change of the Lorentz forces.

These requirements for the limited time change of the angle and the current I through the gradient coil system can be transferred to k-space trajectories.

Analogous to a velocity v in positional space, the role of a momentary velocity can be allocated to a gradient vector G in k-space. The analogy between velocity vector v in position space and gradient vector G is based on the comparison of the coordinates r in positional space and k in k-space. The following apply:

$$k(t) = \int_0^t G(t')dt' \tag{8}$$

and $$r(t) = \int_0^t v(t')dt'. \qquad (9)$$

t or, respectively, t' thereby describe respective time variables.

According to this embodiment, the invention can be formulated in an analogy model so that a limited (amplitude or angular) acceleration in k-space is present for a trajectory with regard to a momentary velocity (v in positional space, G in k-space) at a defined point in time. This viewpoint is repeatedly referenced in the following Specification.

The control sequence according to the invention is determined according to the method according to the invention that is described above and has the cited limitations of the momentary direction change rate, the momentary amplitude change rate or, respectively, the momentary gradient change rate.

The invention also encompasses a method for operation of a magnetic resonance imaging system in which the control sequence according to the invention is initially determined and then the magnetic resonance imaging system is operated using this control sequence.

The determination of the control sequence according to the invention for a magnetic resonance imaging system takes place with a control sequence determination device according to the invention. The control sequence determination device has an input interface to register a target magnetization and a k-space gradient trajectory parameter and/or an associated k-space gradient trajectory parameter value. The k-space gradient trajectory parameters or corresponding parameter values are, for example, a trajectory type with associated parameter values, for example "radial" or "Cartesian". Additional k-space gradient trajectory parameters or, respectively, associated parameter values that can likewise be included in the k-space gradient trajectory parameters or k-space gradient trajectory values are explained within the scope of the invention.

Moreover, the control sequence determination device also has a control sequence optimization unit that is designed to optimize the control sequence so that the change of the gradient magnetic field is limited according to the invention for at least a predetermined portion of the control sequence to control a gradient magnetic field. For this purpose, an amplitude change rate limit value, a direction change rate limit value and/or a gradient change rate limit value can be provided via suitable interfaces, for example via a user interface by the operator or by adopting specifications from other files (a control protocol, for example).

Furthermore, according to the invention the control sequence determination device has a control sequence output interface which provides the finished control sequence wholly or in part for further use in the magnetic resonance imaging system or to a buffer.

According to the invention, a magnetic resonance imaging system is also designed with a gradient coil system and a control device to implement a desired measurement on the basis of the of a predetermined control sequence to control the gradient coil system. The magnetic resonance imaging system has a control sequence determination device according to the invention in order to determine a control sequence and to pass this to the control device. A transfer of the control sequence to the control device can take place wholly or in part, such that (for example) an operation of the magnetic resonance imaging system can take place on the basis of portions of the control sequence according to the invention while other portions of said control sequence are still being optimized by the control sequence optimization unit.

A majority of the aforementioned components of the control sequence determination device—in particular the control sequence optimization unit—can be realized wholly or in part in the form of software modules in a processor or a corresponding control device, a control sequence determination device or another processor of the magnetic resonance imaging system.

Realization of the control sequence determination device (advantageously the control sequence optimization unit) largely in software has the advantage that even magnetic resonance imaging systems or control devices or the like that have previously already been in use can simply be retrofitted via a software update in order to operate in the manner according to the invention. The object is also achieved by a computer program product which, for example is stored in a transportable memory and/or is provided for transfer via a network, and thus can be loaded directly into one or more memories of the control sequence determination device, the control device, or the magnetic resonance imaging system. The computer program product includes program code segments in order to execute all steps of the method to determine a control sequence according to the invention when the program is executed in the control device or the control sequence determination device or the magnetic resonance imaging system.

As noted, the predetermined portion of the control sequence comprises multiple successive RF pulses. The predetermined portion of the control sequence furthermore preferably comprises at least 80% (preferably at least 60%, particularly preferably at least 40% and especially preferably at least 20%, or for example even at least 10%) of the total duration of the control sequence or the k-space coordinates that are activated in the course of the control sequence.

The realization is based on the fact that individual spoiler pulses that incur significant changes of the gradient magnetic field in particular still do not make a significant contribution to the noise generation due to the typically excellent mechanical damping of the magnetic resonance imaging system or, respectively, gradient coil system. According to the invention, the limitations according to the invention can be exceeded in remaining regions of the trajectory (outside of the limiting segments) without an unacceptable noise exposure resulting.

In an embodiment of the invention, the predetermined amplitude change rate limit value corresponds to a predetermined amplitude change rate fraction of a maximum amplitude change rate of the gradient magnetic field of the magnetic resonance imaging system that is actually possible due to design. The maximum possible amplitude change rate due to design in modern apparatuses typically lies in the range of 200 mT/m/ms.

Alternatively or additionally, in this case the predetermined direction change rate limit value can correspond to a predetermined direction change rate fraction of the maximum direction change rate of the magnetic field of the magnetic resonance imaging system that is actually possible due to design. In presently common magnetic resonance imaging systems, the maximum possible direction change rate due to design is typically in a range of 180°/ms.

In this case (likewise alternatively or additionally), the predetermined gradient change rate limit value can also correspond to a predetermined gradient change rate fraction of the maximum gradient change that is actually possible due to design. The maximum possible gradient change rate is thereby determined by the maximum possible direction change rate and the maximum possible amplitude change rate. The fraction is based on a combination according to a given combination rule of the maximum possible amplitude change rate and the maximum possible direction change rate of the gradient magnetic field of the magnetic resonance imaging system.

This means that at least one, preferably multiple, or even all of the limit values (amplitude change rate limit value, direction change rate limit value, gradient change rate limit value) provided for the limitation according to the invention likes below the corresponding associated, apparatus-specific maximum value that is possible.

Damping devices for magnetic resonance imaging systems are typically optimized with regard to possible peak exposure values, and moreover are also adapted to a corresponding spectrum of resulting mechanical oscillations. This consideration can be used in the establishment of the limit values described above in the form of fractions of the respective maximum value that is actually possible. The optimization of the magnetic resonance imaging system according to the invention is determined, among other things, by a maximum slew rate and a maximum direction change rate of the gradient magnetic field with regard to the respective magnetic resonance imaging system. The maximum slew rate is provided by the maximum possible change of the gradient current and concerns the maximum change rate of the magnitude of the magnetic field generated by the gradient coils, i.e. the maximum possible amplitude change rate.

The maximum speed of the angle change in turn depends on the present gradient coil arrangement and the possibilities of the magnetic resonance imaging system to operate gradient coils independently of one another. In the simplest case, the maximum direction change rate is dependent—again due to the slew rate—on differently oriented gradient coils of the gradient coil system that are to be operated independently, and their orientation relative to one another. The maximum possible speed of the angle change is thus also in turn an individual, design-dependent characteristic value of the gradient coil system.

The simultaneously provided limitation of a momentary direction change rate and a momentary amplitude change rate leads to the situation that the magnetic resonance imaging system is in any case operated within its load limits, and a tolerance remains that is not exceeded even given combination of loads resulting from an amplitude change and a simultaneous direction change of the gradient magnetic field. It should be emphasized that this tolerance can be individually associated with a specific magnetic resonance imaging system or an examination subject, thus is adjustable. For example, this means that the tolerance can be chosen differently for the examination of a child than for the examination of an adult, or for the examination of a bronchial system than for the examination of the head. For example, the amplitude change rate fraction can be at most 80%, preferably at most 60%, particularly preferably at most 40% and especially preferably at most 20%.

Alternatively or additionally, the direction change rate fraction can be at most 80%, preferably at most 60%, particularly preferably at most 40% and especially preferably at most 20%.

Moreover, the gradient change rate fraction alternatively or additionally be at most 80%, preferably at most 60%, particularly preferably at most 40% and especially preferably at most 20%.

The change rate fractions could respectively be transmitted as parameters or parameter values to the input interface of the control sequence determination device, for example, and advantageously be included in the k-space gradient trajectory parameters. The possibility is thus opened up to provide the maximum permissible load limits, via which it is ensured that a noise reduction is reliably achieved. This can take place specific to the gradient coil system and in particular also automatically, for example with the aid of a database which automatically provides the required parameters or, respectively, the associated parameter values, and in fact depending on the respective magnetic resonance imaging system operated with the use of the control sequence and/or on the examination subject. However, in the same manner it is also conceivable that these adjustments are made by a user of a control sequence determination device or even of a magnetic resonance imaging system.

As noted, the noise generation in the echo signal-based image acquisition is particularly intensive. This applies particularly in the case of control sequences with which the raw magnetic resonance data are acquired at least in part based on a gradient echo method (GRE), a spin echo method (SE), a turbo spin echo method (TSE) or an echoplanar imaging method (EPI). It is common to these methods that switching of the gradient magnetic field at a switching frequency in the radio-frequency range is required for data acquisition. Moreover, such control sequences are designed to be time-optimized—for example by targeted dephasing of the magnetic dipoles with the use of spoiler pulses—such that in many cases a particularly strong excitation of the gradient coil system to structural (mechanical) oscillations and a particularly strong noise development are the result. The limitation according to the invention—and the specification of a noise, limit optimization goal in the form of the change rate fractions—can thus make these control sequences, which are accompanied by many advantages with regard to contrast gain, accessible to new use cases.

Preferably, at least 50% of the acquired raw magnetic resonance data are acquired along a single k-space trajectory. This quasi-continuous trajectory is advantageously optimized within the scope of the invention so that a direction reversal with regard to a coordinate of k-space is accompanied by a wide (optimally wide) distance in k-space with regard to another coordinate of k-space. For example, this wide distance can be achieved by intersection points of the trajectory with itself, as will be explained below.

As already explained, compliance with the limitations of the momentary amplitude change rate and the momentary direction change rate or the momentary gradient change relaxation time occurs even given a transition from a first trajectory to a second trajectory in k-space that chronological immediately follows said first trajectory.

This preferably takes place by, in the transition from the first trajectory to the second trajectory, causing the gradient magnetic field to be transitioned during a first step to an end value in stages (i.e. with multiple changes to the momentary direction and the momentary amplitude in the course of the first trajectory) while maintaining the limitations according to the invention. The gradient magnetic field at this end point essentially corresponds at least on a spatial direction (i.e. advantageously in the direction of a coordinate $k_x$, $k_y$, $k_z$) to a basic magnetic field at a start point of the second trajectory in k-space which is scanned immediately chronologically following the first trajectory. However, the start point of the second trajectory in k-space and the end point of the first trajectory in k-space are not identical; these two points deviate from one another in k-space in at least one k-space coordinate. Insofar as the end point of the first trajectory corresponds to a point in k-space that has a mirrored algebraic sign at a k-space coordinate, which point essentially forms the start point of the second trajectory, the transition can be achieved in that a modified setting of the magnetization (in particular an inversion of the magnetization) relative to the basic magnetic field or, respectively, a present setting of the magnetization is generated by means of an RF pulse. This is equivalent to a "position change".

In this case, the gradient magnetic field thus does not change, or changes only within the scope of the limitations according to the invention, i.e. at most with a predetermined momentary amplitude change rate and a predetermined momentary direction change rate, such that the advantages according to the invention can therefore also be achieved with regard to the noise reduction.

The formulation of the gradient magnetic fields so as to essentially correspond in at least one spatial direction at the start point and at the end point still permits small changes of the gradient magnetic field to additionally take place within the scope of the limitations according to the invention, and permits the start point and end point in k-space to differ in all coordinates. Within the scope of the invention, however, it must be ensured that compliance with the limitations in the transition between start point and end point occurs. This means that the momentary amplitude change rate and momentary direction change rate can deviate from zero during the transition.

The control sequences generated with the aid of the invention are preferably characterized in that an angle change of the magnetic field of at least 90°—particularly preferably of at least 180°—takes place in the course of a trajectory, preferably in the limiting segments of the control sequence. Trajectories in k-space can thus be scanned that likewise change their direction by more than 90° or 180° in their course. Partial trajectories in which the direction of the trajectory changes are designated in the following as "angle change segments" in k-space. The section of the control sequence that is designed to scan a partial trajectory that has a direction change of more than 90° is also designated in the following as a "turn sequence" in k-space.

The trajectory and the control device can be designed as mentioned so that k-space can be scanned in a single trajectory.

As noted above, particularly in echo-based acquisition methods the turn (direction reversal) sequences form a significant source of noise generation. With the use of the invention it is possible to optimize the course of an individual trajectory or of a partial trajectory so that the noise generation is reduced specifically in the course of corresponding turn sequences, this in angle change segments in k-space. The limitations frequently entail the necessity that partial trajectories of the trajectory that are arranged in parallel in k-space are spaced "far" apart from one another in k-space, as is already noted above.

The wide spacing of the partial trajectories in k-space in particular appears in that an intersection point of the trajectory with itself and/or an additional trajectory of the control sequence preferably lies in the course of the trajectory in an angle change segment. The occurrence of intersection points means that at least one (straight) partial trajectory or "neighboring track" in k-space is jumped over in a turn sequence in the scanning of k-space. It is thus possible to completely scan k-space with straight partial trajectories while complying with the cited limitations. For straight partial trajectories, a simultaneous limitation of the momentary amplitude change rate and the momentary direction change rate does not necessary involve an advantage in the noise generation, meaning that the simultaneous limitation of the cited change rates (amplitude, direction, gradient) can be canceled in straight partial trajectories without negatively affecting the noise optimization.

An acquisition of the magnetic resonance data therefore preferably takes place only in the straight partial trajectories since these can be executed relatively quickly, i.e. without the limitations according to the invention, for example. There is thus nearly no time loss due to the limitation that is imposed according to the invention.

K-space is preferably scanned on the basis of the control sequence in a trajectory that includes multiple straight line partial trajectories that are parallel to one another in k-space. In this case, the trajectory in k-space in turn preferably has at least one intersection point with itself. The scanning of k-space can take place, for example, essentially like a lawnmower in a serpentine trajectory. This type of trajectory thus represents a modification of a typical Cartesian scanning of k-space.

Moreover, k-space can alternatively or additionally also be scanned on the basis of the control sequence in a trajectory that has an intersection point with itself in a central region of k-space. This intersection point is scanned more than twice in the course of the trajectory. A corresponding trajectory thus has a certain "radial portion", meaning that the trajectory runs similar to what are known as radial sequences that scan k-space in multiple trajectories with a central intersection point of all trajectories.

In the described case of a central intersection point of the trajectory with itself, the trajectory can alternatively or additionally have one or more intersection points with itself in radially outward regions of k-space in angle change segments in which in particular an angle change of the gradient magnetic field of at least 180° takes place. This trajectory thus realizes a radial scan of k-space with end turning loops that enable the parameter limitations according to the invention to be complied with, such that a significant noise source in the image acquisition can be suppressed. As mentioned, it can be the case that no acquisition of raw magnetic resonance data takes place during the execution of the end turning loops, such that said end turning loops can be equated to the transition between partial trajectories scanned in chronological succession in which a raw magnetic resonance data acquisition then respectively takes place.

In addition to partial trajectories, the case described in the preceding can thus also apply to multiple trajectories that have a common intersection point in a central region.

From the above description, it is apparent that the invention concerns preferred control sequences that scan k-space with the use of one or more of Cartesian or radial trajectories, preferably in a three-dimensional volume region of the examination subject. For example, in addition to the requirements of echo-based imaging, the trajectories also have a number of angle change segments (preferably turn sequences or transitions between trajectories acquired in chronological succession) for which it is particularly necessary to limit the noise generation.

DESCRIPTION OF THE PREFERRED EMBODIMENTS

Figure 1:
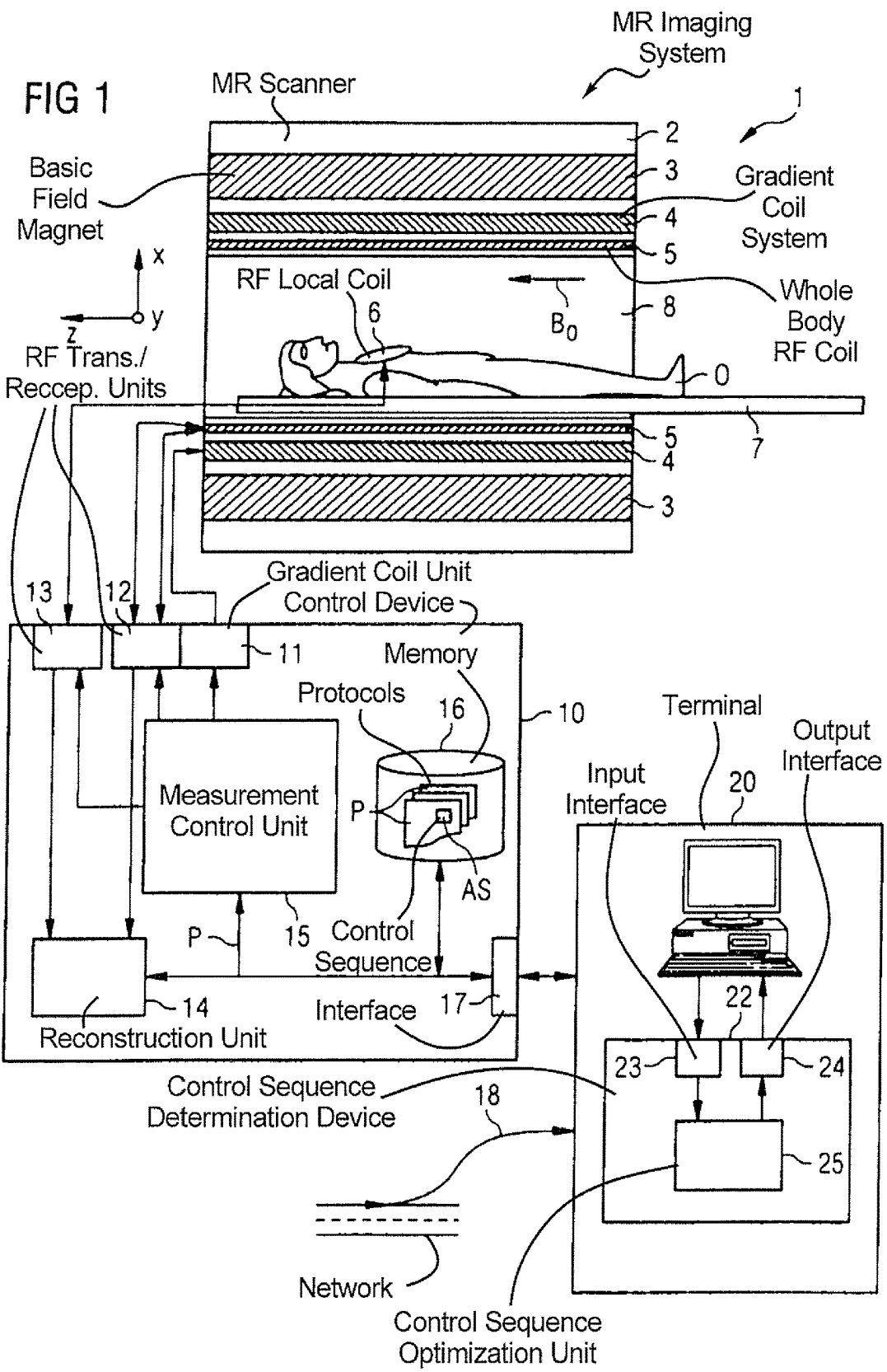
FIG. 1 illustrates an exemplary embodiment of a magnetic resonance imaging system according to the invention.

A magnetic resonance imaging system 1 according to the invention is shown in schematic form in FIG. 1. The imaging system 1 includes the actual magnetic resonance scanner (data acquisition unit) 2 with a measurement space or patient tunnel 8 located therein. A bed 7 can be driven into this patient tunnel 8 so that a patient O or test subject thereupon can be supported at a specific position within the magnetic resonance scanner 2 relative to the gradient coil system 4 arranged therein during an examination or can be driven between different positions during a measurement (data acquisition).

Basic components of the magnetic resonance scanner 2 include a basic field magnet 3 to generate a basic magnetic field $B_0$, the gradient coil system 4 with gradient coils in order to apply nearly any gradient magnetic fields in the x-, y- and z-directions, and a whole-body radio-frequency coil 5. The reception of magnetic resonance signals produced in the test subject or examination subject O can take place via the whole-body coil 5 with which the radio-frequency signals to produce the magnetic resonance signals are normally also emitted. However, the magnetic resonance signals are typically received with local coils 6 arranged on or below the examination subject O, for example. Alternatively, radio-frequency signals to deflect the nuclear spins can also be emitted by the local coils 6. These components are known in principle to those skilled in the art and therefore are only schematically depicted in FIG. 1.

In the exemplary embodiment of FIG. 1, the whole-body radio-frequency coil 5 is designed as a birdcage antenna. This can be controlled by a control device 10, for example with multiple independent transmission channels. The control device 10 can be a control computer that can also include a number of individual computers that may possibly be spatially separated and connected among one another via suitable cables or other communication links. This control device 10 is connected via a terminal interface 17 with a terminal 20 via which an operator can control the entire magnetic resonance imaging system 1. In the present case, this terminal 20 is formed as a computer with keyboard, one or more monitors and additional input devices (for example mouse or the like) so that a graphical user interface is provided to the user.

Among other things, the control device 10 has a gradient coil unit 11 that can in turn include multiple sub-components. The individual gradient coils of the gradient coil system 4 are supplied with control signals via this gradient coil unit 11. These control signals are gradient pulses that are applied at precisely set points in time and with a precisely predetermined time curve during a measurement. This is explained in more detail below.

The control device 10 also has a radio-frequency transmission/reception unit 12. For example, magnetic resonance signals can also be received via this transmission/reception unit 12, but reception typically occurs with the use of the local coils 6. The magnetic resonance data acquired with these local coils 6 are read out by a local coil transmission/reception unit 13 and processed. The magnetic resonance signals received by these or by the whole-body coil 5 or the local coil 6 by means of the RF transmission/reception unit 12 or the local coil transmission/reception unit 13 are passed as raw magnetic resonance data RD to a reconstruction unit 14 that reconstructs image data therefrom and stores the reconstructed data in a memory 16 and supplies the reconstructed data via the interface 17 to the terminal 20 so that the operator can view the image data. The data can also be provided to other memories or additional processing means (a "Picture Archive System" (PACS), for example), for storage, display, or evaluation, via a network 18.

The gradient control unit 11, the radio-frequency transmission/reception unit 12, and the local coil transmission/reception unit 13 for the local coils 6 are respectively controlled in coordination by a measurement control unit 15. Via corresponding commands, the measurement control unit 15 ensures that a desired gradient pulse train is emitted via suitable gradient coil signals with the RF transmission/reception unit 12 controlled in parallel so that the matching radio-frequency pulses are radiated to the whole-body coil 5. Moreover, it must therefore be ensured that the magnetic resonance signals at the local coils 6 are read out and processed further by the local coil transmission/reception unit 13, or that possible signals at the whole-body coil 5 are read out and processed further by the RF transmission/reception unit 12 at the matching point in time. The measurement control unit 15 provides the corresponding signals to the transmission/reception units 12 and 13 and the gradient pulse train to the gradient coil unit 11 according to a predetermined control protocol P. All control data that must be set during a measurement are stored in this control protocol P.

A number of control protocols P for different measurements are typically stored in a memory 16. These can be selected and possibly modified by the operator via the terminal 20 in order to then have an appropriate control protocol P available for the currently desired measurement, with which the measurement control unit 15 can operate. Moreover, the operator can retrieve control protocols P via a network 18 (for example from a manufacturer of the magnetic resonance system 1) and then modify and use these as necessary.

The basic workflow of such a magnetic resonance measurement and the cited components for control are known to those skilled in the art, and thus need not be addressed in further detail herein. Moreover, such a magnetic resonance scanner 2 and the associated control device 10 can have a number of additional components that are likewise not explained in detail herein.

At this point it is noted that the magnetic resonance scanner 2 can also be designed differently, for example with a laterally open patient space or measurement space 8, and the whole-body radio-frequency coil 5 in principle does not need to be designed as a birdcage antenna.

Moreover, a control sequence determination device 22 that serves to determine a magnetic resonance system control sequence AS is schematically shown in FIG. 1. The magnetic resonance system control sequence is created as part of the measurement protocol in the present case.

In FIG. 1, the control sequence determination device 22 is depicted as part of the terminal 20 and can be realized in the form of software components thereof or as a computer program executed by the computer of this terminal 20. In principle, however, the control sequence determination device 22 can also be part of the control device 10 itself or be realized at a separate computer system, and the finished control sequences are possibly also transmitted to the magnetic resonance imaging system 1 via a network 18 within the scope of a complete control protocol P.

Here the control sequence determination device 22 has an input interface 23. A target magnetization ZM (see FIG. 2) is transmitted via this input interface 23 (as explained in detail using FIG. 2) to the control sequence determination device 22, which target magnetization ZM specifies how the flip angle distribution—i.e. the deflection of the spins (which deflection is possibly locally different) relative to the basic magnetic field $B_0$—should be in the desired measurement (wherein the flip angle respectively indicates the statistical mean deflection angle of the spins at the appertaining location, for example in a specific voxel). K-space gradient trajectory parameters or associated k-space gradient trajectory parameter values are also transmitted to the control sequence determination device 22 via the input interface 23. The k-space gradient trajectory parameters can include the trajectory type TY; the predetermined proportion OR of the control sequence AS; the amplitude change rate fraction RF of the maximum achievable slew rate of the gradient coil system; and/or a direction change rate fraction RF of a maximum achievable direction change rate of the gradient magnetic field. In the exemplary embodiment, these parameters and the associated parameter values are combined into a common data set and are transmitted via the input interface 23 to the control sequence determination device 22. The influence of these parameters on the control sequence AS is explained in more detail later.

For example, the described specifications are made by an expert in the development of control protocols P for specific measurements. The data transmitted to the input interface 23 are passed to a control sequence optimization unit 25 that then automatically creates a specific control sequence AS based on the target magnetization ZM and the provided k-space gradient trajectory parameters or, respectively, the parameter values. As is specifically explained in the following, one or more k-space gradient trajectories is/are modified or optimized. The control sequence AS that is thereby generated is then emitted as an output again via a control sequence output interface 24 and can be passed to the control device 10, for example within the scope of a control protocol P in which are specified additional specifications for controlling the magnetic resonance imaging system 1.

The workflow of such a method to determine a magnetic resonance system control sequence AS is explained in more detail in the following using FIG. 2.

In a first Step OPT1, the target magnetization ZM and the k-space gradient trajectory parameters of one or more gradient trajectories (noted with regard to FIG. 1) are initially provided. Due to the specification of the amplitude change rate fractions AF and direction change rate fractions RF, the gradient trajectory parameters also implicitly include amplitude change rate limit values $AR_{Max}$ and direction change rate limit values $RR_{Max}$. These change rate limit values and the gradient change rate limit value $GR_{Max}$ or the gradient change rate fraction GF can alternatively be likewise included in the k-space gradient trajectory parameters or the associated values and be transmitted to the input interface. A portion OR of the control sequence AS is also provided that should be limited according to the invention.

The specification of the parameter values takes place so that the geometry of the gradient trajectory for optimization is still variable. This means that (as was already indicated) only an initial basic geometry (i.e. the trajectory type TY, for example a radial scan of k-space or a Cartesian scan of k-space) is provided with the aid of the k-space gradient trajectory parameters.

In a further Step OPT2, an optimization of the gradient trajectory TT is made under consideration of the parameters or parameter values received via the input interface and the limitation according to the invention, as this will be explained in more detail using FIG. 3.

In a subsequent Step OPT4, the determined gradient trajectory TT that is optimized according to the invention is checked as to whether the provided portion OR of the control sequence AS in which the limitation according to the invention should be complied with is reached.

If this is not the case ("n" branch), the optimization according to OPT2 is continued further under consideration of the achieved portion CR in which the limitation is complied with, and in fact until the achieved portion CR corresponds at least to the predetermined portion OR. Otherwise ("y" branch), the optimized trajectory TT can be used for the further method.

In a further Step OPT3—which can take place either simultaneously with Step OPT2 or, respectively, also following this, before Step OPT4, as is indicated by the representation with dashed lines—an RF pulse series is generated matching the gradient trajectory TT such that the target magnetization ZM is achieved. The control sequence that is optimized in such a manner can then be directly used to control the gradient coil system and the RF system.

The optimization is explained further in the following using FIG. 3. FIG. 3 shows a gradient trajectory TT through k-space in section. The course of the trajectory TT in k-space is determined by the current gradient magnetic field respectively applied at the different points in time. The direction and amplitude or, respectively, strength of the gradient magnetic field are described in summary in the form of a gradient vector G (see Equation (2). In a first segment of the trajectory TT that is designated with PA in FIG. 3, the gradient vector G has an initial amplitude value $A_1$ and an initial direction $R_1$. In a final time segment T, the change of the gradient vector G into a final amplitude value $A_2$ and a final direction $R_2$ takes place so that the gradient vector G' has these values in a chronologically immediately following second segment PB of the trajectory TT.

Figure 3:
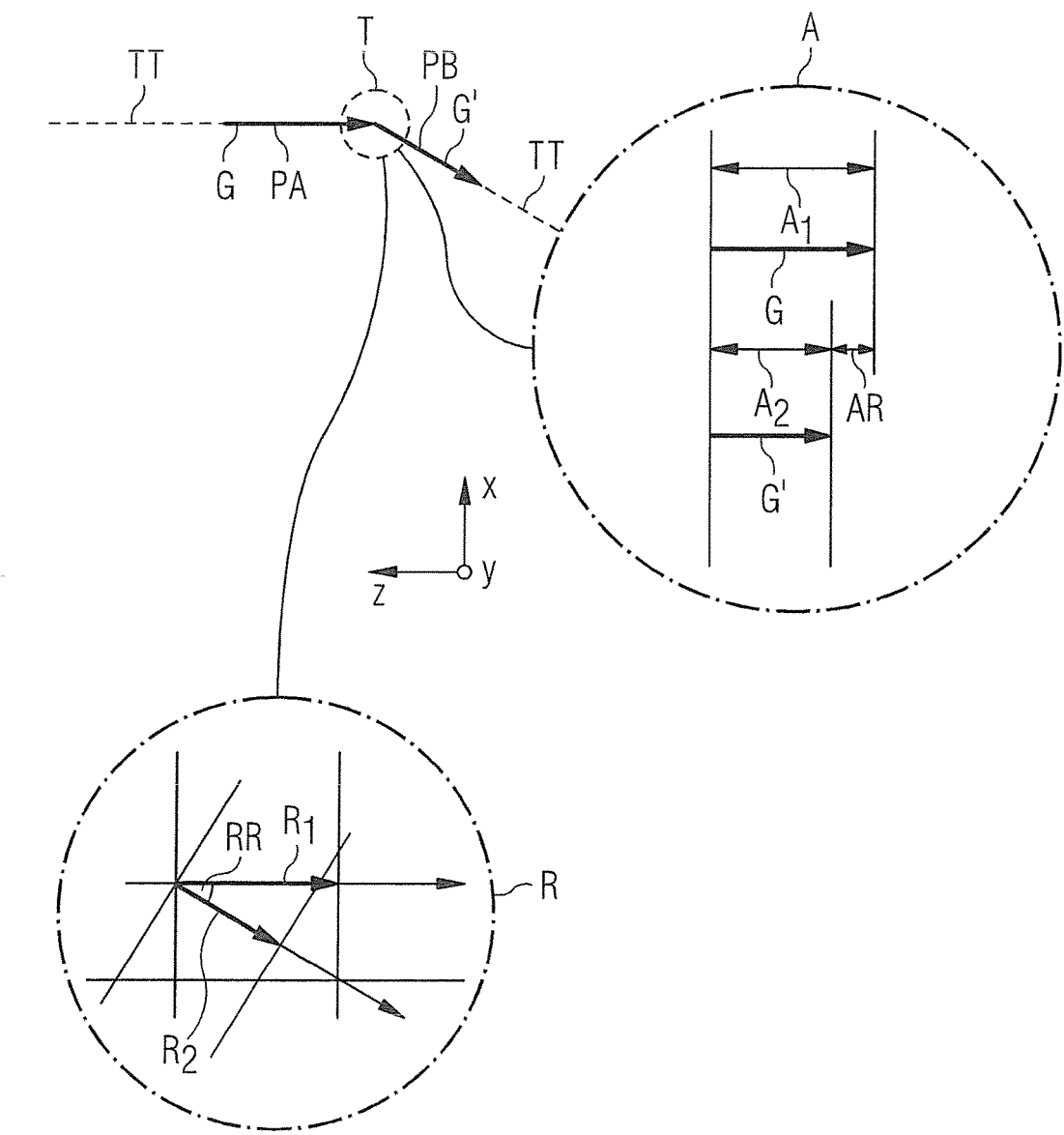
FIG. 3 schematically shows the limitation of the change parameter of a gradient trajectory.

FIG. 3 shows the transition of the amplitude values in the time segment T in more detail in the detail presentation designated with A. The change of the amplitude thereby takes place in the time segment T from an initial amplitude $A_1$ in the first segment PA of the trajectory to a final amplitude $A_2$ in the second segment PB of the trajectory TT. The momentary amplitude change rate AR corresponds to the limit value of the absolute difference of the initial amplitude $A_1$ and the final amplitude $A_2$ formed for the minimal final time segment T (which here amounts to 100 μs and defines the "moment", for example) divided by the time segment T.

To clarify the depiction, the time segment T in FIG. 3 is selected so that the absolute difference of the amplitudes $A_1$ and $A_2$ corresponds precisely to the momentary amplitude change rate AR in the time segment T. However, a discontinuous switching of the amplitudes from $A_1$ to $A_2$ would incur a momentary amplitude change rate AR that is much higher than the absolute difference of the amplitudes $A_1$ and $A_2$. According to the invention, this much higher momentary amplitude change rate AR is now limited as an optimization condition so that a discontinuous switching of the gradient magnetic field (as would technically be possible in the imaging system) is avoided.

Figure 2:
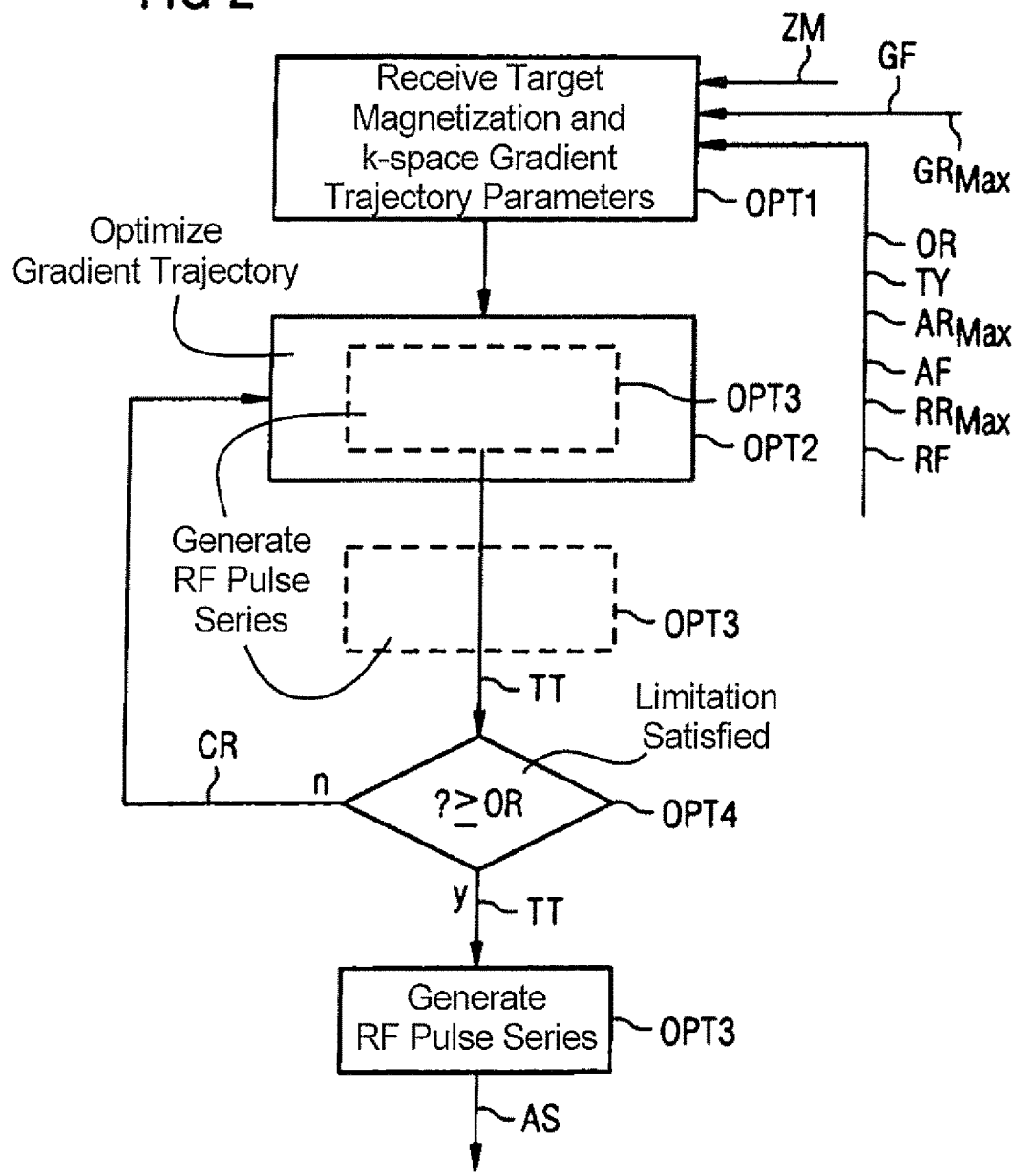
FIG. 2 is a flowchart of an exemplary embodiment of the method according to the invention to determine a control sequence.

An additional detail depiction of FIG. 2 that is designated with R clarifies the term "momentary direction change rate RR". Considered again in time segment T, a time change results from an initial direction $R_1$ to a final direction $R_2$ of the gradient magnetic field G. The momentary direction change rate RR is then determined from the absolute difference (i.e. calculation of a difference quotient over time) of the initial direction $R_1$ to the final direction $R_2$ divided by the time period T, wherein initial and final direction can be respectively described by an angle in k-space. The time period T was in turn selected for clarification so that the difference angle precisely corresponds to the direction change rate RR; this means that the momentary direction change rate RR would again be markedly higher given discontinuous switching of the gradient magnetic field. According to the invention, this much higher momentary direction change rate RR is now likewise limited as an optimization condition. It is thereby to be noted that the direction change rate is also limited with regard to the tangential path of the gradient trajectory in the case of control sequences that scan an examination subject three-dimensionally.

In other words, the momentary change rate of the amplitude or the direction of the gradient magnetic field is a momentary change rate that describes a variation of the amplitude or the direction related to a short but finite time period. Either or both of these change rates can be mathematically described as a result of a limit process of the variation of the amplitude or the direction in this minimal time period, so that a discontinuous switching of gradient magnetic fields is suppressed via the optimization conditions. The momentary direction change rate RR thus corresponds to the speed of the change of the angle of the gradient magnetic field, and the momentary amplitude change rate AR corresponds to the momentary slew rate of the gradient coil system. Both parameters are limited by technical boundary conditions of the gradient coil system.

In the present exemplary embodiment, these boundary conditions can be explicitly considered as an optimization condition for the course of a gradient trajectory TT, and the momentary amplitude change rate AR and the momentary direction change rate RR can thus be optimally limited under consideration of predetermined change rate limit values that are due to the desired volume reduction. The amplitude change rate limit value is selected here so that it corresponds to a predetermined amplitude change rate fraction of a maximum possible amplitude change rate of the gradient magnetic field.

In the shown exemplary embodiment, the amplitude change rate limit value amounts to 80% of the maximum slew rate of the magnetic resonance imaging system (i.e. of the gradient coil system thereof) that corresponds to approximately 170 T/ms, meaning that the amplitude change rate limit value amounts to 136 T/ms and the amplitude change rate fraction is thus 80%.

The momentary direction change rate RR is limited in the same way so that it falls below a direction change rate limit value that is lower than the design-dependent maximum speed of the angle change of the magnetic field of this gradient coil system or, respectively, magnetic resonance imaging system. The maximum angular velocity—thus the design-dependent maximum speed of the change of the angle of the gradient magnetic field—typically amounts to 45°/ms. The direction change rate limit value can in turn be described with the use of a predetermined direction change rate fraction of the maximum possible direction change rate of the gradient magnetic field of the magnetic resonance imaging system.

In the shown example, the direction change rate limit value amounts to 80% of the maximum angular velocity of the gradient magnetic field in this magnetic resonance imaging system, thus approximately 36°/ms, meaning that the direction change rate fraction thus amounts to 80%.

Translated into the image of the momentary velocity, the requirement describes that the momentary amplitude change rate AR and the momentary direction change rate RR are limited so that the trajectories travel through k-space with a limited acceleration with regard to the amplitude and a limited velocity of the angle change, i.e. angular velocity.

An analogy to auto racing can be made, for example. In order to arrive at an optimal lap time, the long straight sections of a lap are optimally driven at the highest speed and the curves are driven with limited angular velocity change due to the centrifugal force. Visually considered, too-small "curves in k-space" that are traversed at too high a speed, and thus lead to an increased noise development, are avoided within the scope of the invention.

Figure 4:
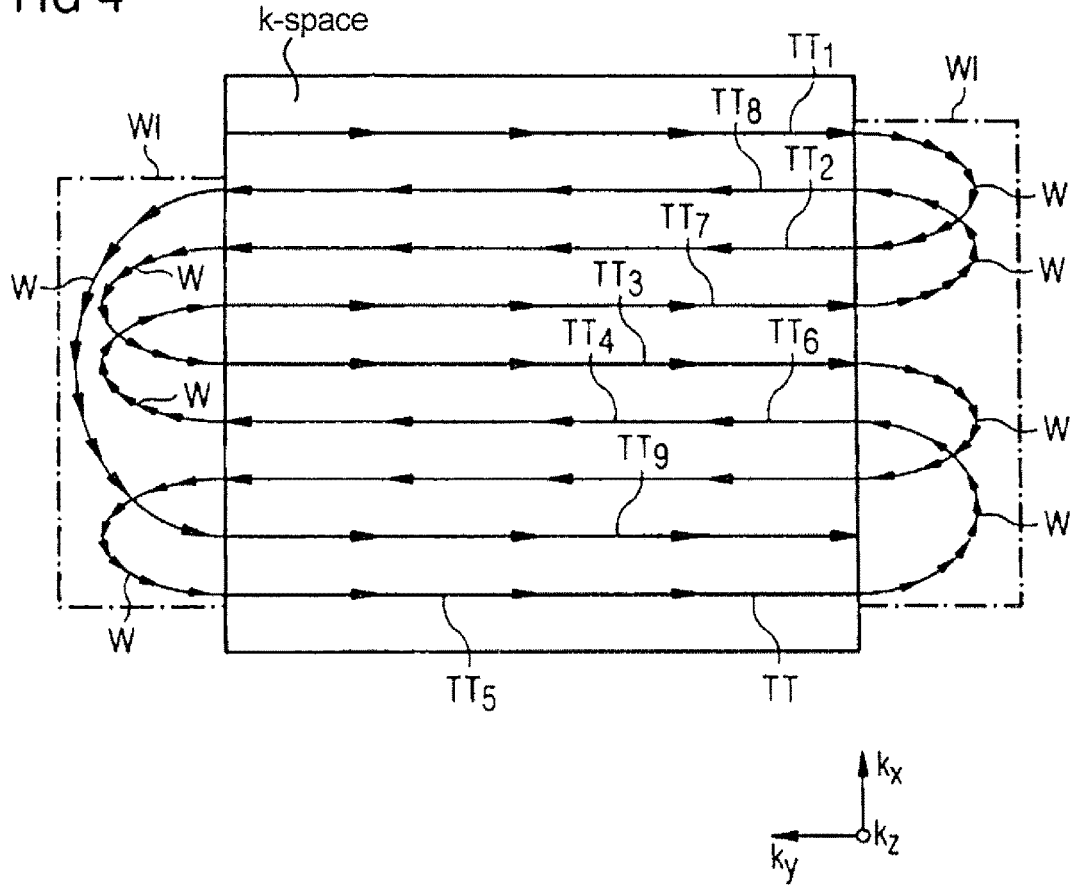
FIG. 4 shows a Cartesian trajectory through k-space that is based on an exemplary embodiment of a control sequence according to the invention.

To clarify the optimal limitations of the gradient magnetic field for noise reduction, FIG. 4 shows an EPI trajectory TT that is based on a control sequence which was determined or, respectively, optimized with simultaneously limited momentary amplitude change rate and momentary direction change rate with the aid of the control sequence optimization unit described in FIG. 1.

As mentioned, the control sequence includes a number of radio-frequency pulses and gradient pulses that establish the course of the trajectory TT in k-space. In this exemplary embodiment, k-space is scanned in an essentially Cartesian trajectory TT. In this case, a Cartesian trajectory type can be selected with the use of a k-space gradient trajectory parameter value that is detected by the input interface (which is likewise described in FIG. 1).

The Cartesian scanning takes place along partial trajectories (sub-trajectories) $TT_1$, $TT_2$, . . . , $TT_9$ proceeding parallel to one another in k-space (here in the $k_y$ direction). Respective raw magnetic resonance data that are processed further (as described with regard to FIG. 1) are acquired during this parallel travel along the partial trajectories $TT_1$, $TT_2$, . . . , $TT_9$. In an angle change segment W in which a direction change of the gradient magnetic field takes place, the trajectory TT is optimized so that a momentary amplitude change rate AR of the gradient magnetic field falls below an amplitude change rate limit value. At the same time, in this angle change segment W the momentary direction change rate RR of the gradient magnetic field is limited so that it falls below the direction change rate limit value.

The angle change segment W constitutes the transition or transitions between partial trajectories $TT_1$, $TT_2$, $TT_3$, . . . , $TT_9$ of the overall trajectory TT that proceed in parallel in k-space. In this exemplary embodiment, no raw magnetic resonance data are acquired in the angle change segments W. These angle change segments W therefore advantageously lie in the angle change regions WI outside of k-space that is actually to be filled with data entries at respective k-space points by the trajectory TT. This is advantageous since the limitations really "cost" only a little measurement time (i.e. extend the measurement time) since the data acquisition in the partial trajectories $TT_1$, $TT_2$, . . . , $TT_9$ traveling in parallel takes place essentially unchanged with identical speed or duration relative to an unlimited trajectory (i.e. a trajectory not optimized according to the invention).

If the angle change segment W is considered at a transition from a first partial trajectory $TT_1$ to a second partial trajectory $TT_2$, it is established that the smaller the momentary direction change rate, the larger the momentary amplitude change rate of the gradient magnetic field. In the aforementioned analogy to auto racing, this means that the tighter the curve, the lower the speed must be. A braking or steering of the car is necessary for this, which (in the analogous image of the invention) does not take place "suddenly" but rather with a limited change rate.

Since the change of the Lorentz forces or the exposure forces is calculated in a linear approximation from the combination of the momentary amplitude change rate and the momentary direction change rate, it is advantageous for the momentary amplitude change rate and the momentary direction change rate not to be limited independently of one another, so as to thereby achieve an optimal speed in the scanning of k-space under consideration of noise reduction aspects.

Therefore, in the exemplary embodiment, a momentary gradient change rate of the gradient magnetic field is established based on a combination of the momentary amplitude change rate and the momentary direction change rate. A gradient change rate limit value $GR_{Max}$ is calculated based on the amplitude change rate limit value $AR_{Max}$ and the direction change rate limit value $RR_{Max}$, meaning that $$GR_{Max} \sim (AR_{Max}, RR_{Max}). \tag{10}$$

In this exemplary embodiment, the limit values $AR_{Max}$ and $RR_{Max}$ correspond to 90% of the maximum slew rate or, respectively, the maximum possible angular velocity change of the magnetic resonance imaging system.

With the previously described combined limit condition by means of a gradient change rate limit value $GR_{Max}$, it is possible to choose the individual limit values $AR_{Max}$ and $RR_{Max}$ to be relatively high—higher in this case than in the previously described exemplary embodiment.

To specifically determine the momentary gradient change rate GR, the momentary amplitude change rate AR and the momentary direction change rate can be set to be dynamically dependent on one another. In a simple form, for example, this can take place via a coefficient description which allows a scaling of the amplitude change limit value $AR_{Max}$ to higher values if a scaling of the momentary direction change rate limit value $RR_{Max}$ to lower values takes place, and vice versa.

In this case, the momentary gradient change rate limit value can then be established (as a special case of the general dependency according to Equation (10)) via the vector Equation $$GR_{Max}(AR_{Max}, RR_{Max}) = (C_1 AR_{Max}, C_2 RR_{Max}). \tag{11}$$

In this case, the coefficient $C_2$ can thereby be a continuous function f of the coefficient $C_1$, meaning that $$C_2 = f(C_1), \tag{12}$$

for example $$C_2 = C_3 - C_1. \tag{13}$$

$C_3$ is a time-invariant constant, and in contrast to this $C_1$ can change over time, for example. In each case, the coefficients are established so that the individual limit values $AR_{Max}$ and $RR_{Max}$ are not exceeded in individual limiting segments.

The gradient change rate limit value $GR_{Max}$ describes a total limit for the time change of the Lorentz forces or, respectively, for the eddy current forces, wherein as described the momentary direction change rate limit values $RR_{Max}$ and momentary amplitude change rate limit values $AR_{Max}$ are, however, scaled in a time-variable manner to establish the gradient change rate limit values $GR_{Max}$.

A transition of the partial trajectory $TT_1$ to the partial trajectory $TT_2$ is thus possible, as shown in FIG. 4, wherein the momentary amplitude change rate is always smaller with increasing momentary direction change rate and vice versa. In the representation of FIG. 4, the amplitude of the gradient magnetic field is indicated by the length of the arrows and the direction of the gradient magnetic field is indicated by the orientation of the arrow points in the amplitude change segment W. As described above, the data acquisition of raw magnetic resonance data essentially takes place as this corresponds to a conventional Cartesian scanning of k-space with multiple partial trajectories $TT_1, TT_2, \ldots, TT_9$. Deviating from the conventional method, however, the gradient magnetic field in the angle change segment W is limited as described in the preceding. In order to comply well with the limit conditions, in contrast to conventional Cartesian trajectories the temporal scanning of k-space can take place so that parallel partial trajectories $TT_1, TT_2, \ldots, TT_9$ situated next to one another in k-space are not acquired in immediate chronological succession. For example, according to the depiction the partial trajectory $TT_8$ that is "initially skipped" (i.e. is acquired later relative to the partial trajectory $TT_2$) is arranged in the $k_x$-direction orthogonal to the $k_y$-direction in k-space, between the partial trajectories $TT_1$ and $TT_2$ traveling essentially in the $k_y$-direction.

In particular, a consequence of this skipping of spatially adjacently acquired or arranged partial trajectories $TT_1, TT_2, \ldots, TT_9$ is that the trajectory TT now has intersection points with itself. In the Cartesian trajectory TT, these intersection points are arranged in an angle change segment W within a turn sequence. For example, if the transition of the partial trajectory $TT_1$ to the partial trajectory $TT_2$ is considered, an intersection point of the trajectory TT with itself that results from the transition of the partial trajectory $TT_7$ to the partial trajectory $TT_8$ is thus present in the corresponding angle change segment W. A direction change of the gradient magnetic field takes place given a transition from the first partial trajectory $TT_1$ to the second partial trajectory $TT_2$, such that the direction of the gradient magnetic field and the direction of the trajectory as well change by 180°. The scanning in the partial trajectory $TT_2$ chronologically following the partial trajectory $TT_1$ takes place in reverse of the direction of the partial trajectory $TT_1$, in particular in the reverse $k_y$-direction.

This complete direction reversal of the trajectory leads to an equidistant, wandering scan of k-space with the use of a single trajectory TT which keeps the noise exposure within limits.

Figure 5:
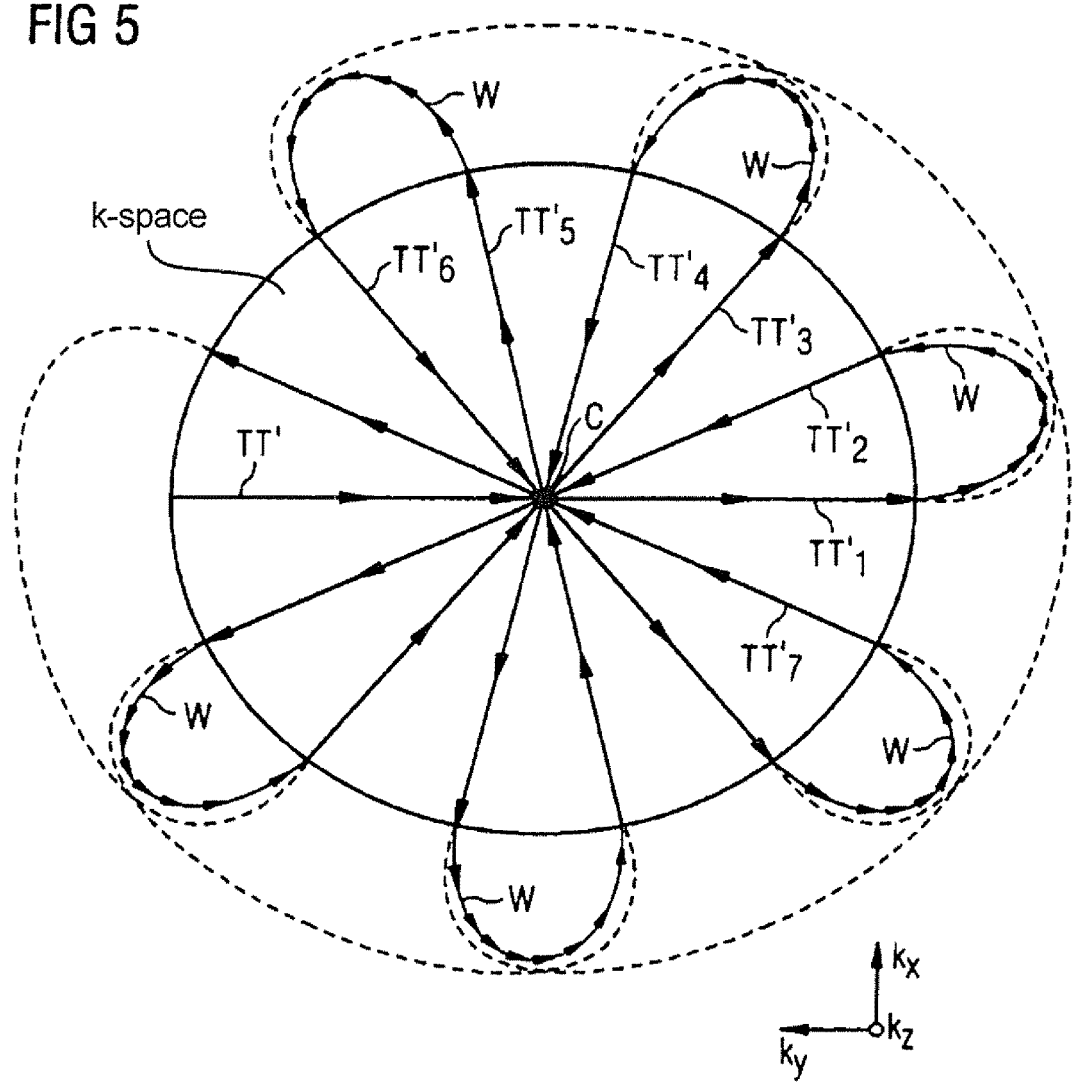
FIG. 5 shows a radial trajectory that is based on an exemplary embodiment of a control sequence according to the invention.

The trajectory TT' of FIG. 5 also seizes on this idea and is only slightly modified relative to conventional radial trajectories through k-space. A trajectory type that is passed to the input interface (mentioned with regard to FIG. 1) for optimization of this trajectory could then be "radial", for example, since the shown trajectory TT' essentially radially scans k-space in a single continuous trajectory. In the shown exemplary embodiment, the acquisition of raw magnetic resonance data takes place in multiple partial trajectories $TT_1', TT_2', \ldots, TT_7'$ that have a common intersection point C in the center of k-space. According to the shown trajectory TT', this common intersection point C is acquired multiple times (exactly seven times in the exemplary embodiment) in the course of the scanning of k-space.

The raw magnetic resonance data acquisition also takes place here exclusively during the scanning if k-space at consistent speed with multiple straight-line partial trajectories $TT_1'$, $TT_2'$, ..., $TT_7'$ traveling in k-space. The transition between these partial trajectories $TT_1'$, $TT_2'$, ..., $TT_7'$ in turn takes place so that the direction change of the gradient magnetic field that is necessary for this and the amplitude change that is necessary for this take place under consideration of the limitations according to the invention. Given a transition from a first partial trajectory $TT_1'$ to a second partial trajectory $TT_2'$, a direction change of the gradient magnetic field or the trajectory TT' of more than 180° is required.

The partial trajectories $TT_1$ an $TT_2$ that are in immediate chronological succession intersect in the center C of k-space, wherein their pass direction in k-space is respectively opposite in the $k_y$-direction.

In contrast to the Cartesian trajectory of FIG. 4, the transition trajectories do not intersect between partial trajectories $TT_1'$, $TT_2'$, ..., $TT_7'$ scanned in immediate chronological succession, although the limitations according to the invention are complied with. However, in the exemplary embodiment the amplitude change rate limit value $AR_{Max}$ and the direction change rate limit value $RR_{Max}$ are chosen to be lower than given the Cartesian scanning of k-space according to FIG. 4. In the exemplary embodiment of the radial trajectory according to FIG. 5, both predetermined change rate portions are only 60%.

As is apparent using the dashed-line transition trajectories (for example between the partial trajectory $TT_1'$ and the partial trajectory $TT_4'$), depending on the limitation of the direction change rate RR or the amplitude change rate AR it can be reasonable to nevertheless provide intersections in the transition region between the partial trajectories $TT_1'$, $TT_2'$, ..., $TT_7'$.

Given consistent limitation the density of the scanning of k-space can be increased or alternatively the limitation of the direction change rate or the amplitude change rate can be changed, such that an optimization with regard to the speed of the scanning of k-space can take place in this regard.

The change rate fractions could likewise be provided via the input interface (mentioned with regard to FIG. 1) of the control sequence determination device, for example by entry of the data by a user. In the same way it is also conceivable that the control sequence determination device or the control sequence optimization unit receives an assignment of the change rate fractions for a specific imaging system. For example, this can take place automatically by means of a query in a database that can be a component of the control sequence determination device 22.

The noise development of the gradient coil system can thus be individually adapted so that an adaptation of the limitation is enabled on the basis of the magnetic resonance imaging system that is used and/or on the basis of the type of examination subject.

It is common to the exemplary embodiments of FIGS. 4 and 5 that an essentially contiguous trajectory TT or, respectively, TT' completely, continuously scans k-space. The noise-critical segments of this trajectory in which a change of the gradient magnetic field takes place are thereby optimized according to the invention, meaning that the gradient vector G is rotated continuously in angle change segments.

In addition to the described type of direction change and amplitude change, the limitation of the direction change rate and amplitude change rate can also concern a specific manner of how trajectories scanned in chronological succession are transitioned into one another with a respective start point or, respectively, end point. This is explained with the use of FIG. 6, which shows a section from a quiet TSE control sequence.

Figure 6:
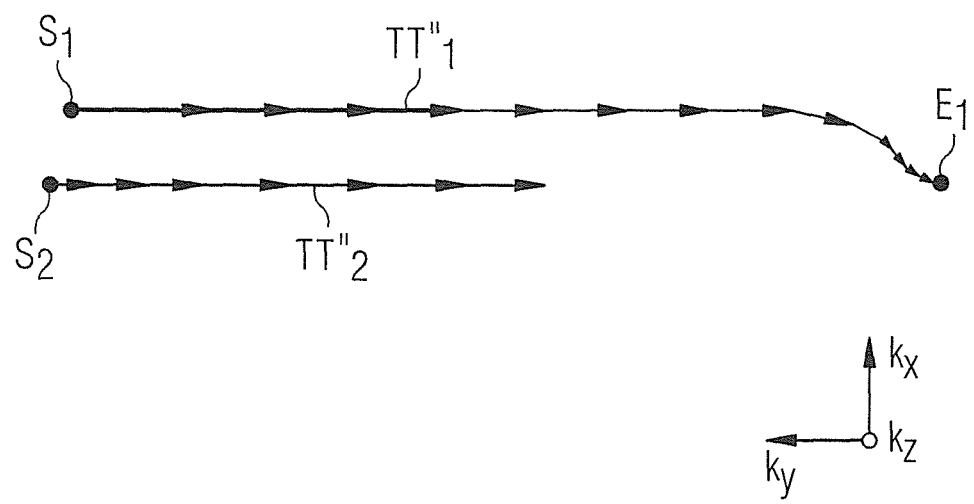
FIG. 6 shows an exemplary embodiment of the transition from a first trajectory to a second trajectory according to the invention.

In the course of a first trajectory that is designated with $TT_1''$ and begins at the start point $S_1$ in FIG. 6, this is driven to an end point $E_1$ in k-space while complying with the limitation according to the invention.

The end point $E_1$ of the first trajectory $TT_1''$ corresponds in the $k_y$-direction to the k-space coordinates of a start point $S_2$ of a second trajectory $TT_2''$. However, the end point $E_1$ of the first trajectory $TT_1''$ differs relative to a start point $S_2$ of a second trajectory $TT_2$ acquired immediately afterward in terms of its k-space coordinates in the $k_x$-direction. The $k_x$-coordinate of the end point $E_1$ of the first trajectory $TT_1''$ corresponds in k-space to an algebraically inverted $k_x$-coordinate of the start point $S_2$ of the second trajectory $TT_2''$. However, the $k_x$-coordinate of the end point $E_1$ can be translated into the $k_x$-coordinate of the start point $S_2$ by mirroring the sign. No change of the actual gradient magnetic field is necessary in order to be able to make this coordinate change in k-space.

This can instead be achieved via reversal of the magnetization of the examination subject, wherein at the same time a mirroring of the k-space coordinate takes place with regard to the origin (thus to -k). Such a re-magnetization is possible with a 180° inversion pulse or, respectively, refocusing pulse, for example. The limitations of the momentary gradient change rate GR according to the invention—in particular of the momentary amplitude change rate AR and the momentary direction change rate RR—thus continue to be satisfied by this transition since the underlying gradient magnetic fields are not switched or modified.

As an alternative to the representations of FIGS. 4 and 5, the possibility thus also exists to achieve a transition between partial trajectories in that the gradient magnetic field at an end point of the partial trajectory respectively essentially coincides with a gradient magnetic field of the start point of the second partial trajectory that is acquired immediately afterward. For example, the coordinate of the start point of the following second partial trajectory in k-space can then be set by mirroring on an axis through the k-space center, this axis running orthogonally to the respective partial trajectory, with a modification of the magnetization.

The invention provides effective measures in order to reduce the noise generation in a magnetic resonance imaging system. It should be noted that the features of all exemplary embodiments or developments disclosed in the figures can be used in any combination, for example for Cartesian TSE, Cartesian GRE, Cartesian EPI, radial TSE or radial EPI control sequences.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method of determining an optimized control sequence configured for a magnetic resonance imaging apparatus, comprising:

using a computer in order to reduce noise generation during acquisition of echo signal-based raw magnetic resonance data, by operating said magnetic resonance imaging apparatus according to an optimized control sequence in order to acquire said echo signal-based raw magnetic resonance data, including controlling entry of said echo signal-based raw magnetic resonance data into an electronic memory representing k-space along at least one trajectory in k-space according to said optimized control sequence;

in said computer, automatically optimizing a control sequence in order to produce an optimized control sequence that optimally generates reduced noise during said acquisition of echo signal-based raw magnetic resonance data, as compared to an operation of said magnetic resonance imaging apparatus in which said control sequence is performed without optimization by, in said optimized control sequence, controlling an amplitude and a direction of a gradient magnetic field emission produced by said magnetic resonance apparatus, with the emitted gradient field causing changes in direction to occur in the k-space of said at least one k-space trajectory, during at least a predetermined portion of said optimized control sequence, by limiting a change with respect to time of the emitted gradient magnetic field;

in said computer, implementing said limiting of said change of said emitted gradient magnetic field so as to limit a sharpness of said changes in the direction of said at least one trajectory that occur in k-space, by selecting said limiting from the group consisting of (a) limiting both a momentary amplitude change rate of the emitted gradient magnetic field, whereby the momentary amplitude change rate of the emitted gradient magnetic field has a value below a predetermined amplitude change rate limit value, and a momentary directional change rate of the gradient magnetic field, whereby the momentary directional change rate of the emitted gradient magnetic field has a value below a predetermined directional change rate limit value, and (b) limiting a momentary change rate of a combination of the amplitude and the direction of the emitted gradient magnetic field whereby the momentary change rate of the combination of the amplitude and the direction of the emitted gradient magnetic field has a value below a predetermined gradient change rate limit value and providing the determined and automatically optimized control sequence as an output to the magnetic resonance imaging apparatus, and/or the terminal interface of the magnetic resonance imaging apparatus, before beginning a magnetic resonance imaging scan, as an indication that the optimization process is complete and that the magnetic resonance imaging apparatus is ready to execute the determined and automatically optimized control sequence.

2. A method as claimed in claim 1 comprising selecting said limiting to be (a), and setting said amplitude change rate limit value to be a predetermined amplitude change rate fraction of a maximum possible amplitude change rate of said emitted gradient magnetic field.

3. A method as claimed in claim 2 comprising selecting said amplitude change rate fraction to be in a range between 80% and 20% of said maximum possible amplitude change rate.

4. A method as claimed in claim 1 comprising selecting said limiting to be (a), and setting said directional change rate limit value to be a predetermined directional change rate fraction of a maximum possible directional change rate of said emitted gradient magnetic field.

5. A method as claimed in claim 4 comprising selecting said directional change rate fraction to be in a range between 80% and 20% of said maximum possible directional change rate.

6. A method as claimed in claim 1 comprising selecting said limiting of the gradient magnetic field to be (b), and setting said change rate limit value of said emitted gradient magnetic field to be a predetermined change rate fraction of a maximum possible change rate of said emitted gradient magnetic field.

7. A method as claimed in claim 6 comprising selecting said predetermined change rate fraction to be in a range between 80% and 20% of said maximum possible change rate.

8. A method as claimed in claim 1 comprising selecting said limiting to be (a), and wherein said momentary amplitude change rate of the emitted gradient magnetic field and said momentary directional change rate of said emitted gradient magnetic field occur during said predetermined portion of said optimized control sequence.

9. A method as claimed in claim 1 comprising selecting said control sequence from the group consisting of a control sequence configured for a gradient echo method of a raw magnetic data acquisition, a spin echo method of a magnetic resonance raw data acquisition, a turbo spin echo method of a magnetic resonance raw data acquisition, and an echo planar imaging method of a magnetic resonance raw data acquisition.

10. A method as claimed in claim 1 comprising acquiring at least 50% of said raw magnetic resonance data along a single trajectory in k-space.

11. A method as claimed in claim 1 comprising acquiring said raw magnetic resonance data along a plurality of trajectories in k-space, and implementing said limiting during a transition from a first of said plurality of trajectories to a second of said plurality of trajectories that chronologically immediately follows said first of said plurality of trajectories in k-space.

12. A method as claimed in claim 11 comprising, during transition from said first of said plurality of trajectories to said second of said plurality of trajectories, transferring said emitted gradient magnetic field in said first of said plurality of trajectories having a first value, to a final value that corresponds to an end point of said first of said plurality of trajectories in k-space, in order to cause the emitted gradient magnetic field at said end point to substantially correspond, in at least one spatial direction, to a gradient magnetic field that is then emitted at a start point of the second of said plurality of trajectories in k-space, with said end point in k-space of the first of said plurality of trajectories deviating from said start point in k-space of the second of said plurality of trajectories.

13. A method as claimed in claim 1 comprising causing an angle change of said emitted gradient magnetic field in said control sequence during a trajectory in k-space to be in a range between 90 degrees and 180 degrees.

14. A method as claimed in claim 1 wherein said at least one trajectory in k-space is a Cartesian trajectory that proceeds through a plurality of parallel lines of k-space in a sequence of said parallel lines in which said raw magnetic resonance data are entered in succession into two of said parallel lines of the sequence that are not adjacent to each other, thereby causing said Cartesian trajectory to intersect itself at an intersection point, and wherein said changes in direction that occur in k-space along said Cartesian trajectory are in a directional change region of k-space, and wherein said intersection point also occurs in said directional change region.

15. A method as claimed in claim 1 comprising acquiring said raw magnetic resonance data in k-space along multiple trajectories, and causing an intersection point of any of said multiple trajectories with any other of said multiple trajectories to be within an angle change segment of said multiple trajectories in k-space.

16. A method as claimed in claim 1 comprising selecting said limiting to be (b), and wherein said momentary change rate of said combination of the amplitude and the direction of the emitted gradient magnetic field occurs during said predetermined portion of said optimized control sequence.

17. A magnetic resonance imaging system, comprising:
a magnetic resonance data acquisition unit;
an electronic memory;
a computer configured to reduce noise generation during acquisition of echo signal-based raw magnetic resonance data by operating said magnetic resonance data acquisition unit according to an optimized control sequence in order to acquire said echo signal-based raw magnetic resonance data, including controlling entry of said echo signal-based raw magnetic resonance data into an electronic memory representing k-space along at least one trajectory in k-space according to said optimized control sequence;
said computer being configured to automatically optimize a control sequence in order to produce an optimized control sequence that optimally generates reduced noise during said acquisition of echo signal-based raw magnetic resonance data, as compared to an operation of said magnetic resonance imaging apparatus in which said control sequence is performed without optimization by, in said optimized control sequence, controlling an amplitude and a direction of a gradient magnetic field emission produced by said magnetic resonance apparatus, whereby the emitted gradient magnetic field causes changes in direction to occur in the k-space of said at least one k-space trajectory in during at least a predetermined portion of said optimized control sequence, by limiting a change with respect to time of the emitted gradient magnetic field; and
in said computer, implementing said limiting of said change of said emitted gradient magnetic field so as to limit a sharpness of said changes in the direction of said at least one trajectory that occurs in k-space, by selecting said limiting from the group consisting of (a) limiting both a momentary amplitude change rate of the emitted gradient magnetic field, whereby the momentary amplitude change rate of the emitted gradient magnetic field has a value below a predetermined amplitude change rate limit value, and a momentary directional change rate of the gradient magnetic field whereby the momentary directional change rate of the emitted gradient magnetic field has a value below a predetermined directional change rate limit value, and (b) limiting a momentary change rate of a combination of the amplitude and the direction of the emitted gradient magnetic field whereby the momentary change rate of the combination of the amplitude and the direction of the emitted gradient magnetic field has a value below a predetermined gradient change rate limit value and
providing the determined and automatically optimized control sequence as an output to the magnetic resonance imaging apparatus, and/or the terminal interface of the magnetic resonance imaging apparatus, before beginning a magnetic resonance imaging scan, as an indication that the optimization process is complete and that the magnetic resonance imaging apparatus is ready to execute the determined and automatically optimized control sequence.

18. A non-transitory, computer-readable data storage medium encoded with programming instructions, said data storage medium being loaded into a computer of a magnetic resonance imaging apparatus, said programming instructions causing said computer when implemented to:
reduce noise generation during acquisition of echo signal-based raw magnetic resonance data by operating said magnetic resonance imaging apparatus according to an optimized control sequence in order to acquire said echo signal-based raw magnetic resonance data, including controlling entry of said echo signal-based raw magnetic resonance data into an electronic memory representing k-space along at least one trajectory in k-space, according to said optimized control sequence;
automatically optimizing a control sequence in order to produce an optimized control sequence that optimally generates reduced noise during said acquisition of echo signal-based raw magnetic resonance data, as compared to an operation of said magnetic resonance imaging apparatus in which said control sequence is performed without optimization by in said optimized control sequence, controlling an amplitude and a direction of a gradient magnetic field emission produced by said magnetic resonance apparatus, with the emitted gradient field causing changes in direction to occur in the k-space of said at least one k-space trajectory, during at least a predetermined portion of said optimized control sequence, by limiting a change with respect to time of the emitted gradient magnetic field; and
implementing said limiting of said change of said emitted gradient magnetic field so as to limit a sharpness of said changes in the direction of said at least one trajectory that occurs in k-space, by selecting said limiting from the group consisting of (a) limiting both a momentary amplitude change rate of the emitted gradient magnetic field, whereby the momentary amplitude change rate of the emitted gradient magnetic field has a value below a predetermined amplitude change rate limit value, and a momentary directional change rate of the gradient magnetic field whereby the momentary directional change rate of the emitted gradient magnetic field has a value below a predetermined directional change rate limit value, and (b) limiting a momentary change rate of a combination of the amplitude and the direction of the emitted gradient magnetic field whereby the momentary change rate of the combination of the amplitude and the direction of the emitted gradient magnetic field has a value below a predetermined gradient change rate limit value and
providing the determined and automatically optimized control sequence as an output to the magnetic resonance imaging apparatus, and/or the terminal interface of the magnetic resonance imaging apparatus, before beginning a magnetic resonance imaging scan, as an indication that the optimization process is complete and that the magnetic resonance imaging apparatus is ready to execute the determined and automatically optimized control sequence.

* * * * *